(12) United States Patent
Takata et al.

(10) Patent No.: US 12,446,388 B2
(45) Date of Patent: Oct. 14, 2025

(54) PHOTODETECTOR ELEMENT AND IMAGE SENSOR

(71) Applicant: FUJIFILM Corporation, Tokyo (JP)

(72) Inventors: Masahiro Takata, Shizuoka (JP); Masashi Ono, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 625 days.

(21) Appl. No.: 17/882,621

(22) Filed: Aug. 8, 2022

(65) Prior Publication Data

US 2022/0384753 A1 Dec. 1, 2022

Related U.S. Application Data

(63) Continuation of application No. PCT/JP2021/004475, filed on Feb. 8, 2021.

(30) Foreign Application Priority Data

Feb. 13, 2020 (JP) ................................. 2020-022575

(51) Int. Cl.
*H10K 30/35* (2023.01)
*H10K 39/32* (2023.01)

(52) U.S. Cl.
CPC ............ *H10K 30/35* (2023.02); *H10K 39/32* (2023.02)

(58) Field of Classification Search
CPC ........................ H10K 30/35–352; H10K 39/32
See application file for complete search history.

(56) References Cited

U.S. PATENT DOCUMENTS 9,318,632 B2 4/2016 Lewis et al.
9,985,153 B2 5/2018 So et al.
(Continued)

FOREIGN PATENT DOCUMENTS

CN 104937722 9/2015
CN 105493295 4/2016
(Continued)

OTHER PUBLICATIONS

Junfeng Xu, Haowei Wang, Shengyi Yang, Guoqiang Ni, Bingsuo Zou, High-sensitivity broadband colloidal quantum dot heterojunction photodetector for night-sky radiation, Journal of Alloys and Compounds, vol. 764, pp. 446-451. Jun. 15, 2018. (Year: 2018).*

(Continued)

*Primary Examiner* — Daniel P Shook
(74) *Attorney, Agent, or Firm* — JCIPRNET

(57) ABSTRACT

There is provided a photodetector element having a photoelectric conversion layer containing an aggregate of semiconductor quantum dots QD1 that contain a metal atom and containing a ligand L1 that is coordinated to the semiconductor quantum dot QD1, and a hole transport layer containing an aggregate of semiconductor quantum dots QD2 that contains a metal atom and containing a ligand L2 that is coordinated to the semiconductor quantum dot QD2, the hole transport layer being arranged on the photoelectric conversion layer, in which a band gap Eg2 of the semiconductor quantum dot QD2 is larger than a band gap Eg1 of the semiconductor quantum dot QD1, and a difference between the band gap Eg2 of the semiconductor quantum dot QD2 and the band gap Eg1 of the semiconductor quantum dot QD1 is 0.10 eV or more. There is also provided an image sensor including the photodetector element.

12 Claims, 1 Drawing Sheet

(56) References Cited

U.S. PATENT DOCUMENTS

| | | | |
|---|---|---|---|
| 2009/0217973 A1 | 9/2009 | Alivisatos et al. | |
| 2015/0263203 A1 | 9/2015 | Lewis et al. | |
| 2017/0062139 A1 | 3/2017 | Gong et al. | |
| 2018/0254421 A1 | 9/2018 | Kinge et al. | |
| 2019/0006541 A1 | 1/2019 | So et al. | |
| 2021/0057168 A1* | 2/2021 | Shiomi | H04N 25/70 |

FOREIGN PATENT DOCUMENTS

| | | |
|---|---|---|
| JP | 2009513018 | 3/2009 |
| JP | 2014093327 | 5/2014 |
| JP | 2015537378 | 12/2015 |
| JP | 2018529214 | 10/2018 |
| WO | 2010134432 | 11/2010 |
| WO | 2019150989 | 8/2019 |

OTHER PUBLICATIONS

Junfeng Xu et al., "High-sensitivity broadband colloidal quantum dot heterojunction photodetector for night-sky radiation," Journal of Alloys and Compounds, vol. 764, Jun. 2018, pp. 446-451.

Marcus L. Böhm et al., "Size and Energy Level Tuning of Quantum Dot Solids via a Hybrid Ligand Complex," The journal of physical chemistry letters, Aug. 2015, pp. 3510-3514.

Santanu Pradhan et al., "Trap-State Suppression and Improved Charge Transport in PbS Quantum Dot Solar Cells with Synergistic Mixed-Ligand Treatments," Small, Apr. 2017, pp. 1-9.

Pawel E. Malinowski et al., "Thin-Film Quantum Dot Photodiode for Monolithic Infrared Image Sensors," Sensors, Dec. 2017, pp. 1-10.

"International Search Report (Form PCT/ISA/210) of PCT/JP2021/004475," mailed on Apr. 27, 2021, with English translation thereof, pp. 1-7.

"Written Opinion of the International Searching Authority (Form PCT/ISA/237)" of PCT/JP2021/004475, mailed on Apr. 27, 2021, with English translation thereof, pp. 1-8.

"Office Action of Korea Counterpart Application", issued on Jan. 31, 2024, with English translation thereof, p. 1-p. 13.

"Office Action of Japan Counterpart Application" with English translation thereof, issued on Jun. 6, 2023, p. 1-p. 8.

"Office Action of China Counterpart Application", issued on Sep. 28, 2024, with English translation thereof, p. 1-p. 7.

"Notice of Final Rejection of Korea Counterpart Application", issued on Oct. 25, 2024, with English translation thereof, p. 1-p. 6.

"Office Action of China Counterpart Application", issued on Jan. 12, 2024, with English translation thereof, p. 1-p. 12.

"Office Action of Taiwan Counterpart Application", issued on Dec. 2, 2024, with English translation thereof, p. 1-p. 7.

* cited by examiner

PHOTODETECTOR ELEMENT AND IMAGE SENSOR

CROSS-REFERENCE TO RELATED APPLICATIONS

This application is a Continuation of PCT International Application No. PCT/JP2021/004475 filed on Feb. 8, 2021, which claims priority under 35 U.S.C § 119(a) to Japanese Patent Application No. 2020-022575 filed on Feb. 13, 2020. Each of the above application(s) is hereby expressly incorporated by reference, in its entirety, into the present application.

BACKGROUND OF THE INVENTION

1. Field of the Invention

The present invention relates to a photodetector element having a photoelectric conversion layer that contains semiconductor quantum dots and an image sensor.

2. Description of the Related Art

In recent years, attention has been focused on photodetector elements capable of detecting light in the infrared region in the fields such as smartphones, surveillance cameras, and in-vehicle cameras.

In the related art, a silicon photodiode in which a silicon wafer is used as a material of a photoelectric conversion layer has been used in a photodetector element that is used in an image sensor or the like. However, a silicon photodiode has low sensitivity in the infrared region having a wavelength of 900 nm or more.

In addition, an InGaAs-based semiconductor material known as a near-infrared light-receiving element has a problem in that it requires extremely high-cost processes such as epitaxial growth for achieving a high quantum efficiency, and thus it has not been widespread.

By the way, in recent years, research on semiconductor quantum dots has been advanced. Pawel E. Malinowski, Epimitheas Georgitzikis, Jorick Maes, Ioanna Vamvaka, Fortunato Frazzica, Jan Van Olmen 1, Piet De Moor, Paul Heremans, Zeger Hens, and David Cheyns, "Thin-Film Quantum Dot Photodiode for Monolithic Infrared Image Sensors", Sensors, 2017, 17, 2867, doi:10.3390/s17122867 describes an invention relating to a photodetector element having a photoelectric conversion layer containing PbS quantum dots.

SUMMARY OF THE INVENTION

In recent years, with the demand for performance improvement of an image sensor and the like, further improvement of various characteristics that are required in a photodetector element used in the image sensor and the like is also required. For example, it is required to further reduce the dark current of the photodetector element. In a case where the dark current of the photodetector element is reduced, a higher signal-to-noise ratio (SN ratio) can be obtained in the image sensor.

According to the study of the inventors of the present invention, it was found that the photodetector element having a photoelectric conversion layer formed of semiconductor quantum dots tended to have a relatively high dark current, and there was room for reducing the dark current. Here, the dark current is a current that flows in a case of not being irradiated with light.

An object of the present invention is to provide a photodetector element in which the dark current is reduced, and an image sensor.

As a result of diligent studies on a photodetector element having a photoelectric conversion layer containing semiconductor quantum dots, the inventors of the present invention found that the dark current can be reduced in a case where a photoelectric conversion layer containing an aggregate of semiconductor quantum dots that contain a metal atom and containing a ligand that is coordinated to the semiconductor quantum dot is used as a photoelectric conversion layer, a hole transport layer containing an aggregate of semiconductor quantum dots that contain a metal atom and containing a ligand that is coordinated to the semiconductor quantum dots is laminated on the photoelectric conversion layer, and semiconductor quantum dots of which the band gap is larger than that of the semiconductor quantum dots of the photoelectric conversion layer are used as semiconductor quantum dots of the hole transport layer, and have completed the present invention.

<1> A photodetector element comprising:
  a photoelectric conversion layer containing an aggregate of semiconductor quantum dots QD1 that contain a metal atom and containing a ligand L1 that is coordinated to the semiconductor quantum dot QD1; and
  a hole transport layer containing an aggregate of semiconductor quantum dots QD2 that contains a metal atom and containing a ligand L2 that is coordinated to the semiconductor quantum dot QD2, the hole transport layer being arranged on the photoelectric conversion layer,
  in which a band gap Eg2 of the semiconductor quantum dot QD2 is larger than a band gap Eg1 of the semiconductor quantum dot QD1, and a difference between the band gap Eg2 of the semiconductor quantum dot QD2 and the band gap Eg1 of the semiconductor quantum dot QD1 is 0.10 eV or more.

<2> The photodetector element according to <1>, in which the semiconductor quantum dot QD1 and the semiconductor quantum dot QD2 each contain a Pb atom.

<3> The photodetector element according to <1> or <2>, in which the semiconductor quantum dot QD1 and the semiconductor quantum dot QD2 each contain the same kind of semiconductor quantum dot.

<4> The photodetector element according to any one of <1> to <3>, in which the semiconductor quantum dot QD1 and the semiconductor quantum dot QD2 each contain PbS.

<5> The photodetector element according to any one of <1> to <4>, in which the ligand L1 and the ligand L2 contain at least one selected from a ligand containing a halogen atom or a polydentate ligand containing two or more coordination moieties.

<6> The photodetector element according to <5>, in which the ligand containing a halogen atom is an inorganic halide.

<7> The photodetector element according to <6>, in which the inorganic halide contains a Zn atom.

<8> The photodetector element according to any one of <1> to <7>, in which the ligand L1 contains thioglycolic acid.

<9> The photodetector element according to any one of <1> to <8>, in which the ligand L2 contains a compound having a thiol group.
<10> The photodetector element according to any one of <1> to <9>, in which the photodetector element is a photodiode-type photodetector element.
<11> An image sensor comprising the photodetector element according to any one of <1> to <10>.
<12> The image sensor according to <11>, in which the image sensor is an infrared image sensor.

According to the present invention, it is possible to provide a photodetector element in which the dark current is reduced, and an image sensor.

DESCRIPTION OF THE PREFERRED EMBODIMENTS

Figure 1:
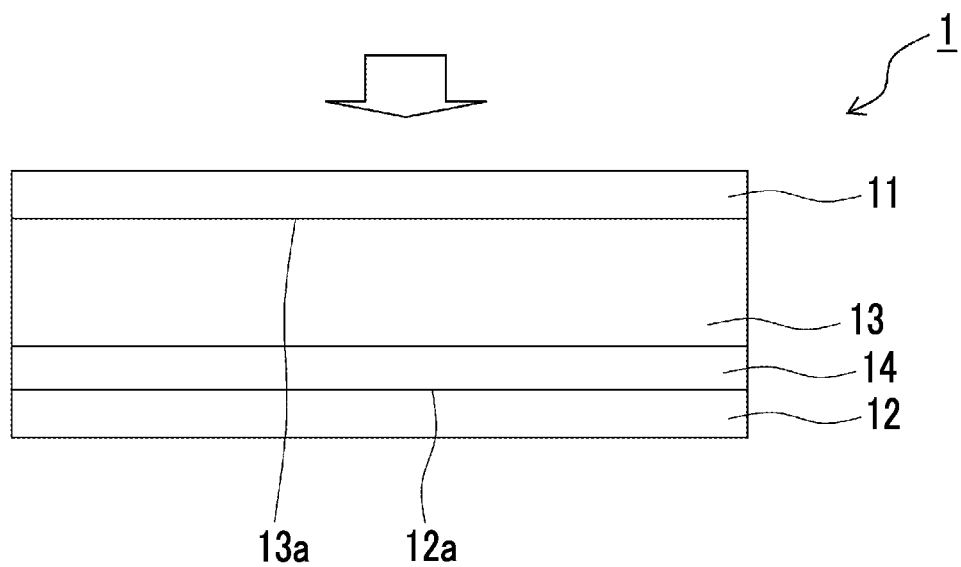
FIG. 1 is a view illustrating an embodiment of a photodetector element.

Hereinafter, the contents of the present invention will be described in detail.

In the present specification, "to" is used to mean that numerical values described before and after "to" are included as a lower limit value and an upper limit value, respectively.

In describing a group (an atomic group) in the present specification, in a case where a description of substitution and non-substitution is not provided, the description means the group includes a group (an atomic group) having a substituent as well as a group (an atomic group) having no substituent. For example, the "alkyl group" includes not only an alkyl group that does not have a substituent (an unsubstituted alkyl group) but also an alkyl group that has a substituent (a substituted alkyl group).

<Photodetector Element>

The photodetector element according to the embodiment of the present invention is characterized by the following facts:

the photodetector element includes a photoelectric conversion layer containing an aggregate of semiconductor quantum dots QD1 that contains a metal atom and containing a ligand L1 coordinated to the semiconductor quantum dot QD1; and a hole transport layer containing an aggregate of semiconductor quantum dots QD2 that contains a metal atom and containing a ligand L2 that is coordinated to the semiconductor quantum dot QD2, the hole transport layer being arranged on the photoelectric conversion layer, in which a band gap Eg2 of the semiconductor quantum dot QD2 is larger than a band gap Eg1 of the semiconductor quantum dot QD1, and a difference between the band gap Eg2 of the semiconductor quantum dot QD2 and the band gap Eg1 of the semiconductor quantum dot QD1 is 0.10 eV or more.

According to the present invention, it is possible to obtain a photodetector element having a low dark current.

In the photodetector element of the embodiment of the present invention, the difference (Eg2−Eg1) between the band gap Eg2 of the semiconductor quantum dot QD2 and the band gap Eg1 of the semiconductor quantum dot QD1 is preferably 0.15 eV or more, more preferably 0.20 eV or more, and still more preferably 0.25 eV or more, from the viewpoint of reducing the dark current. In addition, the difference (Eg2−Eg1) between the band gap Eg2 of the semiconductor quantum dot QD2 and the band gap Eg1 of the semiconductor quantum dot QD1 can be set to 2.0 eV or less or can be 1.0 eV or less.

In the photodetector element of the embodiment of the present invention, the energy level at the upper end of the valence band of the hole transport layer is preferably higher than the energy level at the upper end of the valence band of the photoelectric conversion layer, and the difference (E2−E1) between the energy level (E2) at the upper end of the valence band of the hole transport layer and the energy level (E1) at the upper end of the valence band of the photoelectric conversion layer is preferably 0.01 eV or more and more preferably 0.01 to 0.25 eV from the viewpoint of repetition stability.

In the photodetector element according to the embodiment of the present invention, an energy difference $\Delta E1$ between a Fermi level of the photoelectric conversion layer and a conductor lower end and an energy difference $\Delta E2$ between a Fermi level of the hole transport layer and the conductor lower end preferably satisfy a relationship of Expression (1). In a case where the relationship of Formula (1) is satisfied, a high external quantum efficiency is easily obtained. It is presumed that as the value of ($\Delta E2 - \Delta E1$) increases, the internal potential at the junction interface increases, and thus carrier separation easily occurs, that is, the number of carriers deactivated by re-bonding decreases.

$$(\Delta E2 - \Delta E1) \geq 0.1 \text{ eV} \tag{1}$$

In Expression (1), the value of ($\Delta E2 - \Delta E1$) is preferably 0.2 eV or more and more preferably 0.4 eV or more. In addition, the value of ($\Delta E2 - \Delta E1$) is more preferably 1.0 eV or less from the viewpoint of suppressing dark current.

In a case where a semiconductor quantum dot containing a Pb atom is used as the semiconductor quantum dot QD1 in the photoelectric conversion layer, in the photoelectric conversion layer, the ratio of the number of Pb atoms having a valence of 1 or less to the number of Pb atoms having a valence of 2 (the number of Pb atoms having a valence of 1 or less/the number Pb atoms having a valence of 2) is preferably 0.20 or less, more preferably 0.10 or less, and still more preferably 0.05 or less. According to this aspect, it is possible to obtain a photodetector element in which the dark current is reduced.

The details of the reason why such effects are obtained are unknown; however, it is presumed to be due to the following points. Examples of the Pb atom having a valence of 2 include a Pb atom bonded (coordinated) to a ligand, a Pb atom bonded to a chalcogen atom, and a Pb atom bonded to a halogen atom. Examples of the Pb atom having a valence of 1 or less include a metallic Pb atom and a Pb atom in the dangling bond state. Here, the amount of free electrons in the photoelectric conversion layer is conceived to be correlated with the dark current, and it is presumed that the dark current can be reduced by reducing the amount of free electrons. It is conceived that the Pb atom having a valence of 1 or less in the photoelectric conversion layer plays a role of an electron donor, and it is presumed that the amount of free electrons in the photoelectric conversion layer can be reduced by reducing the ratio of the Pb atom having a valence of 1 or less. For this reason, it is presumed that the dark current of the photodetector element can be further reduced.

Further, in a case where a semiconductor quantum dot containing a Pb atom is used as the semiconductor quantum dot QD2 in the hole transport layer, in the hole transport layer, the ratio of the number of Pb atoms having a valence of 1 or less to the number of Pb atoms having a valence of 2 is preferably 0.15 or less, more preferably 0.10 or less, and still more preferably 0.05 or less. According to this aspect as well, it is possible to obtain a photodetector element in which the dark current is reduced.

In the present specification, the value of the ratio of the number of Pb atoms having a valence of 1 or less to the number of Pb atoms having a valence of 2 in the photoelectric conversion layer and the hole transport layer (hereinafter, both are also collectively referred to as a semiconductor film) is a value measured by X-ray photoelectron spectroscopy using an X-ray photoelectron spectroscopy (XPS) apparatus. Specifically, an XPS spectrum of the Pb4f (7/2) orbital of the semiconductor film is subjected to the curve fitting by the least squares method to carry out the waveform separation into a waveform W1 of which the intensity peak is present in a range of a bond energy of 137.8 to 138.2 eV and a waveform W2 of which the intensity peak is present in a range of a bond energy of 136.5 to 137 eV. Then, the ratio of a peak surface area S2 of the waveform W2 to the peak surface area S1 of the waveform W1 is calculated, and this value is taken as the ratio of the number of Pb atoms having a valence of 1 or less to the number of Pb atoms having a valence of 2 in the semiconductor film. Here, in the measurement by X-ray photoelectron spectroscopy, the bond energy of the intensity peak may fluctuate slightly depending on the reference sample. In the semiconductor quantum dot containing a Pb atom, a Pb—X bond between the Pb atom and an anion atom X paired with the Pb atom, where the Pb—X bond has a valence of 2, is present. Therefore, the contribution from Pb—X or a bond having an intensity peak at the same position of the bond energy as Pb—X is combinedly added to obtain the above-described peak surface area S1. Then, the contribution from a bond having an intensity peak at a position where the bond energy is lower than that is defined as the peak surface area S2. For example, as the ratio of the number of Pb atoms having a valence of 1 or less to the number of Pb atoms having a valence of 2 in a semiconductor film, it is possible to use a value that is calculated by using a waveform having an intensity peak at a bond energy of 138 eV as the waveform W1 and a waveform having an intensity peak at a bond energy of 136.8 eV as the waveform W2.

Examples of the means by which the ratio of the number of Pb atoms having a valence of 1 or less to the number of Pb atoms having a valence of 2 in the semiconductor film is set to be 0.20 or less include a method of bringing the semiconductor film into contact with an aprotic solvent to carry out rinsing at the time of manufacturing a semiconductor film or drying the semiconductor film in an atmosphere of an oxygen-containing gas.

Hereinafter, the details of the photodetector element according to the embodiment of the present invention will be described.

(Photoelectric Conversion Layer)

The photoelectric conversion layer of the photodetector element according to the embodiment of the present invention has aggregates of the semiconductor quantum dots QD1 containing a metal atom. The aggregate of semiconductor quantum dots means a form in which a large number of semiconductor quantum dots (for example, 100 or more quantum dots per 1 $\mu m^2$) are arranged close to each other. In addition, the "semiconductor" in the present invention means a substance having a specific resistance value of 10-2 Ωcm or more and 108 Ωcm or less.

The semiconductor quantum dot QD1 is a semiconductor particle having a metal atom. It is noted that in the present invention, the metal atom also includes a metalloid atom represented by a Si atom. Examples of the semiconductor quantum dot material that constitutes the semiconductor quantum dot QD1 include a nano particle (a particle having a size of 0.5 nm or more and less than 100 nm) of a general semiconductor crystal [a) a Group IV semiconductor, b) a compound semiconductor of a Group IV to IV element, a Group III to V element, or a Group II to VI element, or c) a compound semiconductor consisting of a combination of three or more of a Group II element, a Group III element, a Group IV element, a Group V element, and a Group VI element].

The semiconductor quantum dot QD1 preferably contains at least one metal atom selected from a Pb atom, an In atom, a Ge atom, a Si atom, a Cd atom, a Zn atom, a Hg atom, an Al atom, a Sn atom, or a Ga atom, more preferably at least one metal atom selected from a Pb atom, an In atom, a Ge atom, or a Si atom, and due to the reason that the effects of the present invention are easily obtained more remarkably, it still more preferably contains a Pb atom.

Specific examples of the semiconductor quantum dot material that constitutes the semiconductor quantum dot QD1 include semiconductor materials having a relatively narrow band gap, such as PbS, PbSe, PbTe, InN, InAs, Ge, InGaAs, CuInS, CuInSe, CuInGaSe, InSb, HgTe, HgCdTe, $Ag_2S$, $Ag_2Se$, $Ag_2Te$, SnS, SnSe, SnTe, Si, and InP. Among them, the semiconductor quantum dot QD1 preferably contains PbS or PbSe, and more preferably contains PbS, due to the reason that it is easy to efficiently convert light in the infrared region (preferably, light having a wavelength of 700 to 2,500 nm) to electrons.

The semiconductor quantum dot QD1 may be a material having a core-shell structure in which a semiconductor quantum dot material is made to the nucleus (the core) and the semiconductor quantum dot material is covered with a coating compound. Examples of the coating compound include ZnS, ZnSe, ZnTe, ZnCdS, CdS, and GaP.

The band gap Eg1 of the semiconductor quantum dot QD1 is preferably 0.5 to 2.0 eV. In a case where the band gap Eg1 of the semiconductor quantum dot QD1 is within the above range, it is possible to obtain a photodetector element capable of detecting light of various wavelengths depending on the use application. For example, it is possible to obtain a photodetector element capable of detecting light in the infrared region. The upper limit of the band gap Eg1 of the semiconductor quantum dot QD1 is preferably 1.9 eV or less, more preferably 1.8 eV or less, and still more preferably 1.5 eV or less. The lower limit of the band gap Eg1 of the semiconductor quantum dot QD1 is preferably 0.6 eV or more and more preferably 0.7 eV or more.

The average particle diameter of the semiconductor quantum dots QD1 is preferably 2 nm to 15 nm. The average particle diameter of the semiconductor quantum dots QD1 is an average value of the particle diameters of ten semiconductor quantum dots which are randomly selected. A transmission electron microscope may be used for measuring the particle diameter of the semiconductor quantum dots.

Generally, a semiconductor quantum dot contains particles of various sizes from several nm to several tens of nm. In a case where the average particle diameter of semiconductor quantum dots is reduced to a size equal to or smaller than the Bohr radius of the electrons present in the inside of the semiconductor quantum dot, a phenomenon in which the band gap of the semiconductor quantum dot changes due to the quantum size effect occurs. In a case where the average particle diameter of semiconductor quantum dots is 15 nm or less, it is easy to control the band gap by the quantum size effect.

The photoelectric conversion layer of the photodetector element according to the embodiment of the present invention contains a ligand L1 that is coordinated to the semiconductor quantum dot QD1. Examples of the ligand include a ligand containing a halogen atom and a polydentate ligand containing two or more coordination moieties. The photoelectric conversion layer may contain only one kind of ligand or may contain two or more kinds of ligands. The ligand L1 preferably includes a ligand different from the ligand L2 of the hole transport layer. Among the above, the photoelectric conversion layer preferably contains a ligand containing a halogen atom and a polydentate ligand. According to this aspect, it is possible for the photodetector element to have a low dark current and have excellent performance such as electrical conductivity, a photocurrent value, an external quantum efficiency, and an in-plane uniformity of external quantum efficiency. It is presumed that the reason why such effects are obtained is as follows. It is presumed that the polydentate ligand is subjected to chelate coordination to the semiconductor quantum dot QD1, and thus it is presumed that the peeling of the ligand from the semiconductor quantum dot QD1 can be suppressed more effectively. In addition, it is presumed that steric hindrance between semiconductor quantum dots QD1 can be suppressed by chelate coordination. For this reason, it is conceived that the steric hindrance between the semiconductor quantum dots QD1 is reduced, and thus the semiconductor quantum dots QD1 are closely arranged to strengthen the overlap of the wave functions between the semiconductor quantum dots QD1. Furthermore, in a case where a ligand containing a halogen atom is further contained as the ligand L1 that is coordinated to the semiconductor quantum dot QD1, it is presumed that the ligand containing a halogen atom is coordinated in the gap where the polydentate ligand is not coordinated, and thus it is presumed that the surface defects of the semiconductor quantum dot QD1 can be reduced. As a result, it is presumed that it is possible for the photodetector element to have a low dark current and have excellent performance such as electrical conductivity, a photocurrent value, an external quantum efficiency, and an in-plane uniformity of external quantum efficiency.

First, the ligand containing a halogen atom will be described. Examples of the halogen atom contained in the ligand include a fluorine atom, a chlorine atom, a bromine atom, and an iodine atom, and an iodine atom is preferable from the viewpoint of coordinating power.

The ligand containing a halogen atom may be an organic halide or may be an inorganic halide. Among the above, an inorganic halide is preferable due to the reason that it is easily coordinated to both the cation site and the anion site of the semiconductor quantum dot QD1. In addition, the inorganic halide is preferably a compound containing a metal atom selected from a Zn atom, an In atom, and a Cd atom, and it is more preferably a compound containing a Zn atom. The inorganic halide is still more preferably a salt of a metal atom and a halogen atom due to the reason that the salt is ionized and easily coordinated to the semiconductor quantum dot QD1.

Specific examples of the ligand containing a halogen atom include zinc iodide, zinc bromide, zinc chloride, indium iodide, indium bromide, indium chloride, cadmium iodide, cadmium bromide, and cadmium chloride, gallium iodide, gallium bromide, gallium chloride, tetrabutylammonium iodide, and tetramethylammonium iodide, and zinc iodide is particularly preferable.

In the ligand containing a halogen atom, the halogen ion may be dissociated from the ligand containing a halogen atom, and the halogen ion may be coordinated on the surface of the semiconductor quantum dot QD1. In addition, a portion of the ligand containing a halogen atom, other than the halogen, may also be coordinated on the surface of the semiconductor quantum dot QD1. To give a description with a specific example, in the case of zinc iodide, zinc iodide may be coordinated on the surface of the semiconductor quantum dot QD1, or the iodine ion or the zinc ion may be coordinated on the surface of the semiconductor quantum dot QD1.

Next, the polydentate ligand will be described. Examples of the coordination moiety contained in the polydentate ligand include a thiol group, an amino group, a hydroxy group, a carboxy group, a sulfo group, a phospho group, and a phosphonate group. The polydentate ligand is preferably a compound containing a thiol group due to the reason that the compound is easily coordinated firmly on the surface of the semiconductor quantum dot QD1.

Examples of the polydentate ligand include a ligand represented by any one of Formulae (D) to (F).

$$X^{D1}-L^{D1}-X^{D2} \quad (D)$$

$$X^{E1}-L^{E1}-X^{E3}-L^{E2}-X^{E2} \quad (E)$$

$$X^{F1}-L^{F1}-X^{F4}-L^{F2}-X^{F2} \quad (F)$$
$$\qquad\qquad |$$
$$\qquad\qquad L^{F3}-X^{F3}$$

In Formula (D), $X^{D1}$ and $X^{D2}$ each independently represent a thiol group, an amino group, a hydroxy group, a carboxy group, a sulfo group, a phospho group, or a phosphonate group, and $L^{D1}$ represents a hydrocarbon group.

in Formula (E), $X^{E1}$ and $X^{E2}$ each independently represent a thiol group, an amino group, a hydroxy group, a carboxy group, a sulfo group, a phospho group, or a phosphonate group, $X^{E3}$ represents S, O, or NH, and $L^{E1}$ and $L^{E2}$ each independently represent a hydrocarbon group.

in Formula (F), $X^{F1}$ to $X^{F3}$ each independently represent a thiol group, an amino group, a hydroxy group, a carboxy group, a sulfo group, a phospho group, or a phosphonate group, $X^{F4}$ represents N, and $L^{F1}$ to $L^{F3}$ each independently represent a hydrocarbon group.

The amino group represented by $X^{D1}$, $X^{D2}$, $X^{E1}$, $X^{E2}$, $X^{F1}$, $X^{F2}$, or $X^{F3}$ is not limited to —NH$_2$ and includes a substituted amino group and a cyclic amino group as well. Examples of the substituted amino group include a monoalkylamino group, a dialkylamino group, a monoarylamino group, a diarylamino group, and an alkylarylamino group. The amino group represented by these groups is preferably —NH$_2$, a monoalkylamino group, or a dialkylamino group, and more preferably —NH$_2$.

The hydrocarbon group represented by $L^{D1}$, $L^{E1}$, $L^{E2}$, $L^{F1}$, $L^{F2}$, or $L^{F3}$ is preferably an aliphatic hydrocarbon group. The aliphatic hydrocarbon group may be a saturated aliphatic hydrocarbon group or may be an unsaturated aliphatic hydrocarbon group. The hydrocarbon group preferably has 1 to 20 carbon atoms. The upper limit of the number of carbon atoms is preferably 10 or less, more preferably 6 or less, and still more preferably 3 or less. Specific examples of the hydrocarbon group include an alkylene group, an alkenylene group, and an alkynylene group.

Examples of the alkylene group include a linear alkylene group, a branched alkylene group, and a cyclic alkylene group. A linear alkylene group or a branched alkylene group is preferable, and a linear alkylene group is more preferable. Examples of the alkenylene group include a linear alkenylene group, a branched alkenylene group, and a cyclic alkenylene group. A linear alkenylene group or a branched alkenylene group is preferable, and a linear alkenylene group is more preferable. Examples of the alkynylene group include a linear alkynylene group and a branched alkynylene group, and a linear alkynylene group is preferable. The alkylene group, the alkenylene group, and the alkynylene group may further have a substituent. The substituent is preferably a group having 1 or more and 10 or less of atoms. Preferred specific examples of the group having 1 or more and 10 or less of atoms include an alkyl group having 1 to 3 carbon atoms [a methyl group, an ethyl group, a propyl group, or an isopropyl group], an alkenyl group having 2 or 3 carbon atoms [an ethenyl group or a propenyl group], an alkynyl group having 2 to 4 carbon atoms [an ethynyl group, a propynyl group, or the like], a cyclopropyl group, an alkoxy group having 1 or 2 carbon atoms [a methoxy group or an ethoxy group], an acyl group having 2 or 3 carbon atoms [an acetyl group or a propionyl group], an alkoxycarbonyl group having 2 or 3 carbon atoms [a methoxycarbonyl group or an ethoxycarbonyl group], an acyloxy group having 2 carbon atoms [an acetyloxy group], an acylamino group having 2 carbon atoms [an acetylamino group], a hydroxyalkyl group having 1 to 3 carbon atoms [a hydroxymethyl group, a hydroxyethyl group, or a hydroxypropyl group], an aldehyde group, a hydroxy group, a carboxy group, a sulfo group, a phospho group, a carbamoyl group, a cyano group, an isocyanate group, a thiol group, a nitro group, a nitroxy group, an isothiocyanate group, a cyanate group, a thiocyanate group, an acetoxy group, an acetamide group, a formyl group, a formyloxy group, a formamide group, a sulfamino group, a sulfino group, a sulfamoyl group, a phosphono group, an acetyl group, a halogen atom, and an alkali metal atom.

In Formula (D), $X^{D1}$ and $X^{D2}$ are separated by $L^{D1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In Formula (E), $X^{E1}$ and $X^{E3}$ are separated by $L^{E1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{E2}$ and $X^{E3}$ are separated by $L^{E2}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In Formula (F), $X^{F1}$ and $X^{F4}$ are separated by $L^{F1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In addition, $X^{F2}$ and $X^{F4}$ are separated by $L^{F2}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{F3}$ and $X^{F4}$ are separated by $L^{F3}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

It is noted that the description that $X^{D1}$ and $X^{D2}$ are separated by $L^{D1}$ by 1 to 10 atoms means that the number of atoms constituting a molecular chain having the shortest distance, connecting $X^{D1}$ and $X^{D2}$, is 1 to 10 atoms. For example, in a case of Formula (D1), $X^{D1}$ and $X^{D2}$ are separated by two atoms, and in cases of Formulae (D2) and (D3), $X^{D1}$ and $X^{D2}$ are separated by 3 atoms. The numbers added to the following structural formulae represent the arrangement order of atoms constituting a molecular chain having the shortest distance, connecting $X^{D1}$ and $X^{D2}$.

(D1)

(D2)

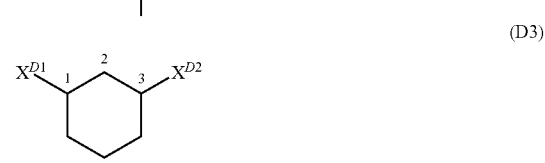

(D3)

To give a description with a specific compound, 3-mercaptopropionic acid is a compound (a compound having the following structure) having a structure in which a portion corresponding to $X^{D1}$ is a carboxy group, a portion corresponding to $X^{D2}$ is a thiol group, and a portion corresponding to $L^{D1}$ is an ethylene group. In 3-mercaptopropionic acid, $X^{D1}$ (the carboxy group) and $X^{D2}$ (the thiol group) are separated by $L^{D1}$ (the ethylene group) by two atoms.

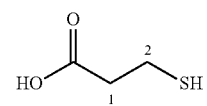

The same applies to the meanings that $X^{E1}$ and $X^{E3}$ are separated by $L^{E1}$ by 1 to 10 atoms, $X^{E2}$ and $X^{E3}$ are separated by $L^{E2}$ by 1 to 10 atoms, $X^{F1}$ and $X^{F4}$ are separated by $L^{F1}$ by 1 to 10 atoms, $X^{F2}$ and $X^{F4}$ are separated by $L^{F2}$ by 1 to 10 atoms, and $X^{F3}$ and $X^{F4}$ are separated by $L^{F3}$ by 1 to 10 atoms.

Specific examples of the polydentate ligand include ethanedithiol, 3-mercaptopropionic acid, thioglycolic acid, 2-aminoethanol, 2-aminoethanethiol, 2-mercaptoethanol, glycolic acid, diethylenetriamine, tris(2-aminoethyl)amine, 4-mercaptobutanoic acid, 3-aminopropanol, 3-merc apto-propanol, N-(3-aminopropyl)-1,3-propanediamine, 3-(bis(3-aminopropyl)amino)propane-1-ol, 1-thioglycerol, dimercaprol, 1-mercapto-2-butanol, 1-mercapto-2-pentanol, 3-mercapto-1-propanol, 2,3-dimercapto-1-propanol, diethanolamine, 2-(2-aminoethyl)aminoethanol, dimethylenetriamine, 1,1-oxybismethylamine, 1,1-thiobismethylamine, 2-[(2-aminoethyl)amino]ethanethiol, bis(2-mercaptoethyl)amine, 2-aminoethane-1-thiol, 1-amino-2-butanol, 1-amino-2-pentanol, L-cysteine, D-cysteine, 3-amino-1-propanol, L-homoserine, D-homoserine, aminohydroxyacetic acid, L-lactic acid, D-lactic acid, L-malic acid, D-malic acid, glyceric acid, 2-hydroxybutyric acid, L-tartaric acid, D-tartaric acid, tartronic acid, and derivatives thereof. Due to the reason that a semiconductor film has a low dark current and a high external quantum efficiency, the polydentate ligand is preferably 3-mercaptopropionic acid, thioglycolic acid, 2-aminoethanol, 2-aminoethanethiol, 2-mercaptoethanol, glycolic acid, diethylenetriamine, tris(2-aminoethyl)amine, 1-thioglycerol, dimercaprol, ethylenediamine, ethyleneglycol, aminosulfonic acid, glycine, (aminomethyl)phosphonic acid, guanidine, diethanolamine, 2-(2-aminoethyl)aminoethanol, homoserine, cysteine, thiomalic acid, malic acid, or tartaric acid, more preferably 3-mercaptopropionic acid, thioglycolic acid, 2-aminoethanol, 2-mercaptoethanol, or 2-aminoethanethiol, and still more preferably 3-mercaptopropionic acid or thioglycolic acid.

The complex stability constant K1 of the polydentate ligand with respect to the metal atom contained in the semiconductor quantum dot QD1 is preferably 6 or more, more preferably 8 or more, and still more preferably 9 or more. In a case where the complex stability constant K1 is 6 or more, the strength of the bond between the semiconductor quantum dot QD1 and the polydentate ligand can be increased. For this reason, it is possible to suppress the peeling of the polydentate ligand from the semiconductor quantum dot QD1, and as a result, it is possible to improve driving durability.

The complex stability constant K1 is a constant determined by the relationship between a ligand and a metal atom which is a target of the coordinate bond, and it is represented by Expression (b).

$$\text{Complex stability constant } K1 = [ML]/([M] \times [L]) \quad \text{(b)}$$

In Expression (b), [ML] represents the molar concentration of a complex formed by bonding a metal atom to a ligand, [M] represents the molar concentration of a metal atom contributing to the coordinate bond, and [L] represents the molar concentration of the ligand.

Practically, a plurality of ligands may be coordinated to one metal atom. However, in the present invention, the complex stability constant K1 represented by Expression (b) in a case where one ligand molecule is coordinated to one metal atom is defined as an indicator of the strength of the coordinate bond.

The complex stability constant K1 between the ligand and the metal atom can be determined by spectroscopy, magnetic resonance spectroscopy, potentiometry, solubility measurement, chromatography, calorimetry, solidifying point measurement, vapor pressure measurement, relaxation measurement, viscosity measurement, surface tension measurement, or the like. In the present invention, the complex stability constant K1 is determined using Sc-Database ver. 5.85 (Academic Software) (2010), which summarizes results from various methods and research institutes. In a case where the complex stability constant K1 is not present in the Sc-Database ver. 5.85, a value described in Critical Stability Constants, written by A. E. Martell and R. M. Smith, is used. In a case where the complex stability constant K1 is not described in the Critical Stability Constants, the above-described measurement method is used or a program PKAS method that calculates the complex stability constant K1 (The Determination and Use of Stability Constants, VCH (1988) written by A. E. Martell et. al.) is used to calculate the complex stability constant K1.

In the present invention, a quantum dot containing a Pb atom (more preferably, PbS is used) is used as the semiconductor quantum dot QD1, and the complex stability constant K1 of the polydentate ligand with respect to the Pb atom is preferably 6 or more, more preferably 8 or more, and still more preferably 9 or more. Examples of the compound having a complex stability constant K1 of 6 or more with respect to the Pb atom include thioglycolic acid (complex stability constant K1 with respect to Pb=8.5) and 2-mercaptoethanol (complex stability constant K1 with respect to Pb=6.7).

The thickness of the photoelectric conversion layer is preferably 10 to 600 nm, more preferably 50 to 600 nm, still more preferably 100 to 600 nm, and even still more preferably 150 to 600 nm. The upper limit of the thickness is preferably 550 nm or less, more preferably 500 nm or less, and still more preferably 450 nm or less.

The refractive index of the photoelectric conversion layer with respect to light of the target wavelength to be detected by the photodetector element is preferably 2.0 to 3.0, more preferably 2.1 to 2.8, and still more preferably 2.2 to 2.7. According to this aspect, in a case where the photodetector element is adopted as a constitutional element of the photodiode, it is easy to realize a high light absorbance, that is, a high external quantum efficiency.

(Hole Transport Layer)

In the photodetector element according to the embodiment of the present invention, a hole transport layer (hereinafter, also referred to as a "hole transport layer QD") containing an aggregate of semiconductor quantum dots QD2 that contains a metal atom and containing a ligand L2 that is coordinated to the semiconductor quantum dot QD2 is arranged on the photoelectric conversion layer. The hole transport layer is a layer having a function of transporting holes generated in the photoelectric conversion layer to the electrode. The hole transport layer is also called an electron block layer. In the photodetector element according to the embodiment of the present invention, it is preferable that the hole transport layer QD is arranged on the surface of the photoelectric conversion layer.

The hole transport layer QD contains an aggregate of the semiconductor quantum dots QD2 containing a metal atom. The semiconductor quantum dot QD2 is a semiconductor particle having a metal atom. The details of the semiconductor quantum dot QD2 are the same as those of the semiconductor quantum dot QD1. The semiconductor quantum dot QD2 preferably contains at least one metal atom selected from a Pb atom, an In atom, a Ge atom, a Si atom, a Cd atom, a Zn atom, a Hg atom, an Al atom, a Sn atom, or a Ga atom, more preferably at least one metal atom selected from a Pb atom, an In atom, a Ge atom, or a Si atom, and due to the reason that the effects of the present invention are easily obtained more remarkably, it still more preferably contains a Pb atom.

Specific examples of the semiconductor quantum dot material that constitutes the semiconductor quantum dot QD2 include semiconductor materials having a relatively narrow band gap, such as PbS, PbSe, PbTe, InN, InAs, Ge, InGaAs, CuInS, CuInSe, CuInGaSe, InSb, Si, and InP. Among them, the semiconductor quantum dot QD2 preferably contains PbS or PbSe and more preferably contains PbS. In addition, the semiconductor quantum dot QD2 preferably contains the same kind of semiconductor quantum dot as the semiconductor quantum dot QD1 contained in the photoelectric conversion layer.

The semiconductor quantum dot QD2 may be a material having a core-shell structure in which a semiconductor quantum dot material is made to the nucleus (the core) and the semiconductor quantum dot material is covered with a coating compound. Examples of the coating compound include ZnS, ZnSe, ZnTe, and ZnCdS.

The band gap Eg2 of the semiconductor quantum dot QD2 is preferably 0.5 to 2.0 eV. In a case where the band gap Eg2 of the semiconductor quantum dot QD2 is within the above range, it is possible to obtain a photodetector element capable of detecting light of various wavelengths depending on the use application. For example, it is possible to obtain a photodetector element capable of detecting light in the infrared region. The upper limit of the band gap Eg2 of the semiconductor quantum dot QD2 is preferably 1.9 eV or less, more preferably 1.8 eV or less, and still more preferably 1.5 eV or less. The lower limit of the band gap Eg2 of the semiconductor quantum dot QD2 is preferably 0.6 eV or more and more preferably 0.7 eV or more.

In the photodetector element of the embodiment of the present invention, the semiconductor quantum dot QD1 and the semiconductor quantum dot QD2 are used, where they satisfy the requirement in which the band gap Eg2 of the semiconductor quantum dot QD2 is larger than the band gap Eg1 of the semiconductor quantum dot QD1, and a difference between the band gap Eg2 of the semiconductor quantum dot QD2 and the band gap Eg1 of the semiconductor quantum dot QD1 is 0.10 eV or more.

The average particle diameter of the semiconductor quantum dots QD2 is preferably 2 nm to 15 nm.

The hole transport layer QD contains the ligand L2 that is coordinated to the semiconductor quantum dot QD2. Examples of the ligand L2 include a ligand containing a halogen atom and a polydentate ligand containing two or more coordination moieties. The hole transport layer QD may contain only one kind of ligand or may contain two or more kinds thereof. Among the above, the hole transport layer QD preferably contains a polydentate ligand, and it more preferably contains a ligand containing a halogen atom, and a polydentate ligand. According to this aspect, it is possible for the photodetector element to have a low dark current and have excellent performance such as electrical conductivity, a photocurrent value, an external quantum efficiency, and an in-plane uniformity of external quantum efficiency.

Examples of the ligand containing a halogen atom include those mentioned as the above-described ligand L1, and the same applies to the preferred range thereof.

Examples of the coordination moiety contained in the polydentate ligand include a thiol group, an amino group, a hydroxy group, a carboxy group, a sulfo group, a phospho group, and a phosphonate group. Examples of the preferred aspect of the polydentate ligand include the ligand represented by any one of Formulae (D) to (F) described above. The polydentate ligand is preferably a compound containing a thiol group. Specific examples of the polydentate ligand include the compounds described in the specific examples of the ligand L1 described above, where ethanedithiol, thioglycolic acid, 3-mercaptopropionic acid, 2-aminoethanol, 2-aminoethanethiol, 2-mercaptoethanol, glycolic acid, 4-mercaptobutanoic acid, 3-aminopropanol, 3-mercaptopropanol, N-(3-aminopropyl)-1,3-propanediamine, or 3-(bis(3-aminopropyl)amino)propane-1-ol is preferable, ethanedithiol, thioglycolic acid, 3-mercaptopropionic acid, 2-aminoethanethiol, or 2-mercaptoethanol is more preferable, ethanedithiol, thioglycolic acid, or 3-mercaptopropionic acid is still more preferable, and thioglycolic acid or 3-mercaptopropionic acid is particularly preferable.

The thickness of the hole transport layer QD is preferably 5 to 100 nm. The lower limit is preferably 10 nm or more. The upper limit is preferably 50 nm or less and more preferably 30 nm or less.

In a case where the photodetector element of the embodiment of the present invention is used as a sensor that senses light having a wavelength of 900 to 1000 nm, it is preferable that the average particle diameter of the semiconductor quantum dots QD1 is 2.9 to 3.3 nm, and the average particle diameter of the semiconductor quantum dots QD2 is 2.0 to 2.8 nm. In this aspect, it is preferable that the semiconductor quantum dot QD1 and the semiconductor quantum dot QD2 each contain a Pb atom, more preferable that they each contain the same kind of semiconductor quantum dot, and still more preferable that they each contain PbS.

In a case where the photodetector element of the embodiment of the present invention is used as a sensor that senses light having a wavelength of 1,500 to 1,600 nm, it is preferable that the average particle diameter of the semiconductor quantum dots QD1 is 5.6 to 6.3 nm, and the average particle diameter of the semiconductor quantum dots QD2 is 4.7 to 5.0 nm. In this aspect, it is preferable that the semiconductor quantum dot QD1 and the semiconductor quantum dot QD2 each contain a Pb atom, more preferable that they each contain the same kind of semiconductor quantum dot, and still more preferable that they each contain PbS.

The photoelectric conversion layer and the hole transport layer can be formed by undergoing a step (a semiconductor quantum dot aggregate forming step) of applying a semiconductor quantum dot dispersion liquid containing semiconductor quantum dots, a ligand that is coordinated to the semiconductor quantum dot, and a solvent onto a substrate to form a film of aggregates of the semiconductor quantum dots. The method for applying a semiconductor quantum dot dispersion liquid onto a substrate is not particularly limited. Examples thereof include coating methods such as a spin coating method, a dipping method, an ink jet method, a dispenser method, a screen printing method, a relief printing method, an intaglio printing method, and a spray coating method.

In addition, after forming a film of aggregates of the semiconductor quantum dots, a ligand exchange step may be further carried out to exchange the ligand coordinated to the semiconductor quantum dot with another ligand. In the ligand exchange step, a ligand solution containing a ligand A and a solvent is applied onto the film of aggregates of the semiconductor quantum dots, formed by the semiconductor quantum dot aggregate forming step, to exchange the ligand coordinated to the semiconductor quantum dot with the ligand A. The ligand A may contain two or more kinds of ligands, and two kinds of ligand solutions may be used in combination. Further, after the ligand exchange, a rinsing step of washing away the excess ligand with a solvent may be included. As the solvent in the rinsing step, it is possible to use an ester-based solvent, a ketone-based solvent, an alcohol-based solvent, a nitrile-based solvent, an amide-based solvent, an ether-based solvent, a hydrocarbon-based solvent, or the like, and an aprotic organic solvent is preferable.

On the other hand, a desired ligand may be applied onto the surface of the semiconductor quantum dot in advance in the semiconductor quantum dot dispersion liquid, and this dispersion liquid may be applied onto the substrate to form a photoelectric conversion layer and a hole transport layer.

The content of the semiconductor quantum dot in the semiconductor quantum dot dispersion liquid is preferably 1 to 500 mg/mL, more preferably 10 to 200 mg/mL, and still more preferably 20 to 100 mg/mL.

Examples of the solvent contained in the semiconductor quantum dot dispersion liquid and the ligand solution include an ester-based solvent, a ketone-based solvent, an alcohol-based solvent, an amide-based solvent, an ether-based solvent, and a hydrocarbon-based solvent. For details thereof, paragraph No. 0223 of WO2015/166779A can be referenced, the content of which is incorporated in the present specification. In addition, an ester-based solvent substituted with a cyclic alkyl group and a ketone-based solvent substituted with a cyclic alkyl group can also be used. It is preferable that the solvent has a small amount of metal impurities, and the metal content is, for example, 10 parts per billion (ppb) by mass or less. A solvent of a level of parts per trillion (ppt) by mass may be used as necessary, and such a solvent is provided by, for example, TOAGOSEI Co., Ltd. (The Chemical Daily, Nov. 13, 2015). Examples of the method for removing impurities such as metals from the solvent include distillation (molecular distillation, thin film distillation, and the like) and filtration using a filter. The filter pore diameter of the filter that is used for filtration is preferably 10 μm or less, more preferably 5 μm or less, and still more preferably 3 μm or less. A material of the filter is preferably polytetrafluoroethylene, polyethylene, or nylon. The solvent may contain isomers (compounds having the same number of atoms but having different structures). In addition, only one kind of isomer may be contained, or a plurality of kinds thereof may be contained.

The photodetector element according to the embodiment of the present invention may have another hole transport layer composed of a hole transport material different from the hole transport layer QD. Examples of the hole transport material that constitutes the other hole transport layer include poly(3,4-ethylenedioxythiophene):poly(4-styrenesulfonic acid) (PEDOT:PSS) and $MoO_3$. In addition, the organic hole transport material disclosed in paragraph Nos. 0209 to 0212 of JP2001-291534A can also be used.

In a case where the photodetector element according to the embodiment of the present invention includes the other hole transport layer, it is preferable that the hole transport layer QD is arranged on the photoelectric conversion layer, and the other hole transport layer is arranged on the hole transport layer QD.

The photodetector element according to the embodiment of the present invention may further have a blocking layer and an electron transport layer. The blocking layer is a layer having a function of preventing a reverse current. The blocking layer is also called a short circuit prevention layer. Examples of the material that forms the blocking layer include silicon oxide, magnesium oxide, aluminum oxide, calcium carbonate, cesium carbonate, polyvinyl alcohol, polyurethane, titanium oxide, tin oxide, zinc oxide, niobium oxide, and tungsten oxide. The blocking layer may be a single-layer film or a laminated film having two or more layers. The electron transport layer is a layer having a function of transporting electrons generated in the photoelectric conversion layer to the electrode. The electron transport layer is also called a hole block layer. The electron transport layer is formed of an electron transport material capable of exhibiting this function. Examples of the electron transport material include a fullerene compound such as [6,6]-phenyl-C61-butyric acid methyl ester ($PC_{61}BM$), a perylene compound such as perylenetetracarboxylic diimide, tetracyanoquinodimethane, titanium oxide, tin oxide, zinc oxide, indium oxide, indium tungsten oxide, indium zinc oxide, indium tin oxide, and fluorine-doped tin oxide. The electron transport layer may be a single-layer film or a laminated film having two or more layers.

The photodetector element according to the embodiment of the present invention is preferably used as an element that detects light having a wavelength in the infrared region. That is, the photodetector element according to the embodiment of the present invention is preferably an infrared photodetector element. In addition, the target light to be detected by the above-described photodetector element is preferably light having a wavelength in the infrared region. In addition, the light having a wavelength in the infrared region is preferably light having a wavelength of more than 700 nm, more preferably light having a wavelength of 800 nm or more, and still more preferably light having a wavelength of 900 nm or more. In addition, the light having a wavelength in the infrared region is preferably light having a wavelength of 2,000 nm or less, more preferably light having a wavelength of 1,800 nm or less, and still more preferably light having a wavelength of 1,600 nm or less.

In addition, the photodetector element according to the embodiment of the present invention may simultaneously detect light having a wavelength in the infrared region and light having a wavelength in the visible region (preferably light having a wavelength in a range of 400 to 700 nm).

Examples of the type of photodetector element include a photoconductor-type photodetector element and a photodiode-type photodetector element. Among the above, a photodiode-type photodetector element is preferable due to the reason that a high signal-to-noise ratio (SN ratio) is easily obtained.

FIG. 1 illustrates an embodiment of a photodiode-type photodetector element. It is noted that an arrow in the figure represents the incidence ray on the photodetector element. A photodetector element 1 illustrated in FIG. 1 includes a lower electrode 12, an upper electrode 11 opposite to the lower electrode 12, and a photoelectric conversion layer 13 provided between the lower electrode 12 and the upper electrode 11, and a hole transport layer 14 provided between the lower electrode 12 and the photoelectric conversion layer 13. The photodetector element 1 illustrated in FIG. 1 is used by causing light to be incident from above the upper electrode 11.

The photoelectric conversion layer 13 is a photoelectric conversion layer containing an aggregate of semiconductor quantum dots QD1 that contain a metal atom and containing a ligand L1 that is coordinated to the semiconductor quantum dot QD1. In addition, the hole transport layer 14 is a hole transport layer containing an aggregate of semiconductor quantum dots QD2 that contains a metal atom and containing a ligand L2 that is coordinated to the semiconductor quantum dot QD2. These details and preferred aspects thereof are as described above.

In addition, a wavelength λ of the target light to be detected by the photodetector element and an optical path length $L^\lambda$ of the light having the wavelength λ from a surface 12a of the lower electrode 12 on a side of the photoelectric conversion layer 13 to a surface 13a of the photoelectric conversion layer 13 on a side of the upper electrode layer preferably satisfy the relationship of Expression (1-1), and more preferably satisfy the relationship of Expression (1-2). In a case where the wavelength λ and the optical path length $L^\lambda$ satisfy such a relationship, in the photoelectric conversion layer 13, it is possible to arrange phases of the light (the incidence ray) incident from the side of the upper electrode 11 and phases of the light (the reflected light) reflected on the surface of the lower electrode 12, and as a result, the light is intensified by the optical interference effect, whereby it is possible to obtain a higher external quantum efficiency.

$$0.05 + m/2 << 0.35 + m/2 \tag{1-1}$$

$$0.10 + m/2 << 0.30 + m/2 \tag{1-2}$$

In the above expressions, λ is the wavelength of the target light to be detected by the photodetector element, $L^\lambda$ is the optical path length of light having a wavelength λ from a surface 12a of the lower electrode 12 on a side of the photoelectric conversion layer 13 to a surface 13a of the photoelectric conversion layer 13 on a side of the upper electrode layer, and m is an integer of 0 or more.

m is preferably an integer of 0 to 4, more preferably an integer of 0 to 3, and still more preferably an integer of 0 to 2. According to this aspect, the transport characteristics of charges such as the hole and the electron are good, and thus it is possible to increase the external quantum efficiency of the photodetector element.

Here, the optical path length means the product obtained by multiplying the physical thickness of a substance through which light transmits by the refractive index. To give a description with the photoelectric conversion layer 13 as an example, in a case where the thickness of the photoelectric conversion layer is denoted by $d^1$ and the refractive index of the photoelectric conversion layer with respect to the wavelength $\lambda^1$ is denoted by $N^1$, the optical path length of the light having a wavelength $\lambda^1$ and transmitting through the photoelectric conversion layer 13 is $N^1 \times d^1$. In a case where the photoelectric conversion layer 13 or the hole transport layer 14 is composed of two or more laminated films or in a case where an interlayer is present between the hole transport layer 14 and the lower electrode 12, the integrated value of the optical path length of each layer is the optical path length The upper electrode 11 is preferably a transparent electrode formed of a conductive material that is substantially transparent with respect to the wavelength of the target light to be detected by the photodetector element. It is noted that in the present invention, the description of "substantially transparent" means that the light transmittance is 50% or more, preferably 60% or more, and particularly preferably 80% or more. Examples of the material of the upper electrode 11 include a conductive metal oxide. Specific examples thereof include tin oxide, zinc oxide, indium oxide, indium tungsten oxide, indium zinc oxide (IZO), indium tin oxide (ITO), and a fluorine-doped tin oxide (FTO).

The film thickness of the upper electrode 11 is not particularly limited, and it is preferably 0.01 to 100 μm, more preferably 0.01 to 10 μm, and particularly preferably 0.01 to 1 μm. It is noted that in the present invention, the film thickness of each layer can be measured by observing the cross section of the photodetector element 1 using a scanning electron microscope (SEM) or the like.

Examples of the material that forms the lower electrode 12 include a metal such as platinum, gold, nickel, copper, silver, indium, ruthenium, palladium, rhodium, iridium, osmium, or aluminum, the above-described conductive metal oxide, a carbon material, and a conductive polymer. The carbon material may be any material having conductivity, and examples thereof include fullerene, a carbon nanotube, graphite, and graphene.

The lower electrode 12 is preferably a thin film of a metal or conductive metal oxide (including a thin film formed by vapor deposition), or a glass substrate or plastic substrate having this thin film. The glass substrate or the plastic substrate is preferably glass having a thin film of gold or platinum, or glass on which platinum is vapor-deposited. The film thickness of the lower electrode 12 is not particularly limited, and it is preferably 0.01 to 100 μm, more preferably 0.01 to 10 μm, and particularly preferably 0.01 to 1 μm.

Although not illustrated in the drawing, a transparent substrate may be arranged on the surface of the upper electrode 11 on the light incident side (the surface opposite to the side of the photoelectric conversion layer 13). Examples of the kind of transparent substrate include a glass substrate, a resin substrate, and a ceramic substrate.

In addition, although not illustrated in the drawing, a blocking layer or the other hole transport layer described above may be provided between the hole transport layer 14 and the lower electrode 12.

In addition, a blocking layer or an electron transport layer may be provided between the photoelectric conversion layer 13 and the upper electrode 11.

Figure 2:
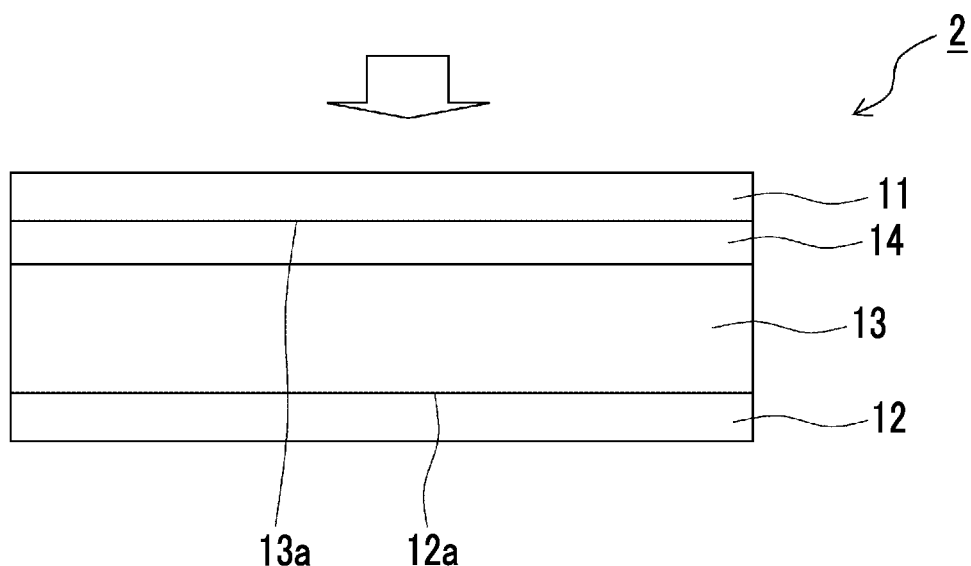
FIG. 2 is a view illustrating another embodiment of a photodetector element.

FIG. 2 illustrates another embodiment of the photodiode-type photodetector element. The photodetector element 1 illustrated in FIG. 2 is the same as the photodetector element of the embodiment illustrated in FIG. 1 except that the hole transport layer 14 is provided between the upper electrode 11 and the photoelectric conversion layer 13.

Although not illustrated in the drawing, a transparent substrate may be arranged on the surface of the upper electrode 11 on the light incident side (the surface opposite to the side of the hole transport layer 14). Examples of the kind of transparent substrate include a glass substrate, a resin substrate, and a ceramic substrate. In addition, although not illustrated in the drawing, a blocking layer or the other hole transport layer described above may be provided between the hole transport layer 14 and the upper electrode 11. In addition, a blocking layer or an electron transport layer may be provided between the photoelectric conversion layer 13 and the lower electrode 12.

<Image Sensor>

The image sensor according to the embodiment of the present invention includes the above-described photodetector element according to the embodiment of the present invention. The configuration of the image sensor is not particularly limited as long as it has the photodetector element according to the embodiment of the present invention and it is a configuration that functions as an image sensor.

The image sensor according to the embodiment of the present invention may include an infrared transmitting filter layer. The infrared transmitting filter layer preferably has a low light transmittance in the wavelength range of the visible region, more preferably has an average light transmittance of 10% or less, still more preferably 7.5% or less, and particularly preferably 5% or less in a wavelength range of 400 to 650 nm.

Examples of the infrared transmitting filter layer include those composed of a resin film containing a coloring material. Examples of the coloring material include a chromatic coloring material such as a red coloring material, a green coloring material, a blue coloring material, a yellow coloring material, a purple coloring material, and an orange coloring material, and a black coloring material. It is preferable that the coloring material contained in the infrared transmitting filter layer forms a black color with a combination of two or more kinds of chromatic coloring materials or a coloring material containing a black coloring material. Examples of the combination of the chromatic coloring material in a case of forming a black color by a combination of two or more kinds of chromatic coloring materials include the following aspects (C1) to (C7).

(C1) an aspect containing a red coloring material and a blue coloring material.

(C2) an aspect containing a red coloring material, a blue coloring material, and a yellow coloring material.

(C3) an aspect containing a red coloring material, a blue coloring material, a yellow coloring material, and a purple coloring material.

(C4) an aspect containing a red coloring material, a blue coloring material, a yellow coloring material, a purple coloring material, and a green coloring material.

(C5) an aspect containing a red coloring material, a blue coloring material, a yellow coloring material, and a green coloring material.

(C6) an aspect containing a red coloring material, a blue coloring material, and a green coloring material.

(C7) an aspect containing a yellow coloring material and a purple coloring material.

The chromatic coloring material may be a pigment or a dye. It may contain a pigment and a dye. The black coloring material is preferably an organic black coloring material. Examples of the organic black coloring material include a bisbenzofuranone compound, an azomethine compound, a perylene compound, and an azo compound.

The infrared transmitting filter layer may further contain an infrared absorber. In a case where the infrared absorber is contained in the infrared transmitting filter layer, the wavelength of the light to be transmitted can be shifted to the longer wavelength side. Examples of the infrared absorber include a pyrrolo pyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a dithiolene metal complex, a metal oxide, and a metal boride.

The spectral characteristics of the infrared transmitting filter layer can be appropriately selected according to the use application of the image sensor. Examples of the filter layer include those that satisfy any one of the following spectral characteristics of (1) to (5).

(1): A filter layer in which the maximum value of the light transmittance in the film thickness direction in a wavelength range of 400 to 750 nm is 20% or less (preferably 15% or less and more preferably 10% or less), and the minimum value of the light transmittance in the film thickness direction in a wavelength range of 900 to 1,500 nm is 70% or more (preferably 75% or more and more preferably 80% or more).

(2): A filter layer in which the maximum value of the light transmittance in the film thickness direction in a wavelength range of 400 to 830 nm is 20% or less (preferably 15% or less and more preferably 10% or less), and the minimum value of the light transmittance in the film thickness direction in a wavelength range of 1,000 to 1,500 nm is 70% or more (preferably 75% or more and more preferably 80% or more).

(3): A filter layer in which the maximum value of the light transmittance in the film thickness direction in a wavelength range of 400 to 950 nm is 20% or less (preferably 15% or less and more preferably 10% or less), and the minimum value of the light transmittance in the film thickness direction in a wavelength range of 1,100 to 1,500 nm is 70% or more (preferably 75% or more and more preferably 80% or more).

(4): A filter layer in which the maximum value of the light transmittance in the film thickness direction in a wavelength range of 400 to 1,100 nm is 20% or less (preferably 15% or less and more preferably 10% or less), and the minimum value thereof in a wavelength range of 1,400 to 1,500 nm is 70% or more (preferably 75% or more and more preferably 80% or more).

(5): A filter layer in which the maximum value of the light transmittance in the film thickness direction in a wavelength range of 400 to 1,300 nm is 20% or less (preferably 15% or less and more preferably 10% or less), and the minimum value thereof in a wavelength range of 1,600 to 2,000 nm is 70% or more (preferably 75% or more and more preferably 80% or more).

Further, as the infrared transmitting filter, the films disclosed in JP2013-077009A, JP2014-130173A, JP2014-130338A, WO2015/166779A, WO2016/178346A, WO2016/190162A, WO2018/016232A, JP2016-177079A, JP2014-130332A, and WO2016/027798A can be used. In addition, as the infrared transmitting filter, two or more filters may be used in combination, or a dual bandpass filter that transmits through two or more specific wavelength ranges with one filter may be used.

The image sensor according to the embodiment of the present invention may include an infrared shielding filter for the intended purpose of improving various performances such as noise reduction. Specific examples of the infrared shielding filter include the filters disclosed in WO2016/186050A, WO2016/035695A, JP6248945B, WO2019/021767A, JP2017-067963A, and JP6506529B.

The image sensor according to the embodiment of the present invention may include a dielectric multi-layer film. Examples of the dielectric multi-layer film include those in which a plurality of layers are laminated by alternately laminating a dielectric thin film having a high refractive index (a high refractive index material layer) and a dielectric thin film having a low refractive index (a low refractive index material layer). The number of laminated layers of the dielectric thin film in the dielectric multi-layer film is not particularly limited; however, it is preferably 2 to 100 layers, more preferably 4 to 60 layers, and still more preferably 6 to 40 layers. The material that is used for forming the high refractive index material layer is preferably a material having a refractive index of 1.7 to 2.5. Specific examples thereof include $Sb_2O_3$, $Sb_2S_3$, $Bi_2O_3$, $CeO_2$, $CeF_3$, $HfO_2$, $La_2O_3$, $Nd_2O_3$, $Pr_6O_{11}$, $Sc_2O_3$, SiO, $Ta_2O_5$, $TiO_2$, TlCl, $Y_2O_3$, ZnSe, ZnS, and $ZrO_2$. The material that is used for forming the low refractive index material layer is preferably a material having a refractive index of 1.2 to 1.6. Specific examples thereof include $Al_2O_3$, $BiF_3$, $CaF_2$, $LaF_3$, $PbCl_2$, $PbF_2$, LiF, $MgF_2$, MgO, $NdF_3$, $SiO_2$, $Si_2O_3$, NaF, $ThO_2$, $ThF_4$, and $Na_3AlF_6$. The method for forming the dielectric multi-layer film is not particularly limited; however, examples thereof include ion plating, a vacuum deposition method using an ion beam or the like, a physical vapor deposition method (a PVD method) such as sputtering, and a chemical vapor deposition method (a CVD method). The thickness of each of the high refractive index material layer and the low refractive index material layer is preferably $0.1\lambda$ to $0.5\lambda$ in a case where the wavelength of the light to be blocked is $\lambda$ (nm). Specific examples of the dielectric multi-layer film include the dielectric multi-layer films disclosed in JP2014-130344A and JP2018-010296A.

In the dielectric multi-layer film, the transmission wavelength range is preferably present in the infrared region (preferably a wavelength range having a wavelength of more than 700 nm, more preferably a wavelength range having a wavelength of more than 800 nm, and still more preferably a wavelength range having a wavelength of more than 900 nm). The maximum transmittance in the transmission wavelength range is preferably 70% or more, more preferably 80% or more, and still more preferably 90% or more. In addition, the maximum transmittance in the shielding wavelength range is preferably 20% or less, more preferably 10% or less, and still more preferably 5% or less. In addition, the average transmittance in the transmission wavelength range is preferably 60% or more, more preferably 70% or more, and still more preferably 80% or more. In addition, in a case where the wavelength at which the maximum transmittance is exhibited is denoted by a central wavelength $\lambda_{t1}$, the wavelength range of the transmission wavelength range is preferably "the central wavelength $\lambda_{t1} \pm 100$ nm", more preferably "the central wavelength $\lambda_{t1} \pm 75$ nm", and still more preferably "the central wavelength $\lambda_{t1} \pm 50$ nm".

The dielectric multi-layer film may have only one transmission wavelength range (preferably, a transmission wavelength range having a maximum transmittance of 90% or more) or may have a plurality of transmission wavelength ranges.

The image sensor according to the embodiment of the present invention may include a color separation filter layer. Examples of the color separation filter layer include a filter layer including colored pixels. Examples of the kind of colored pixel include a red pixel, a green pixel, a blue pixel, a yellow pixel, a cyan pixel, and a magenta pixel. The color separation filter layer may include colored pixels having two or more colors or having only one color. It can be appropriately selected according to the use application and the intended purpose. As the color separation filter layer, for example, the filter disclosed in WO2019/039172A can be used.

In addition, in a case where the color separation layer includes colored pixels having two or more colors, the colored pixels of the respective colors may be adjacent to each other, or a partition wall may be provided between the respective colored pixels. The material of the partition wall is not particularly limited. Examples thereof include an organic material such as a siloxane resin or a fluororesin, and an inorganic particle such as a silica particle. In addition, the partition wall may be composed of a metal such as tungsten or aluminum.

In a case where the image sensor according to the embodiment of the present invention includes an infrared transmitting filter layer and a color separation layer, it is preferable that the color separation layer is provided on an optical path different from the infrared transmitting filter layer. In addition, it is also preferable that the infrared transmitting filter layer and the color separation layer are arranged two-dimensionally. The fact that the infrared transmitting filter layer and the color separation layer are two-dimensionally arranged means that at least a part of both is present on the same plane.

The image sensor according to the embodiment of the present invention may include an interlayer such as a planarizing layer, an underlying layer, or an intimate attachment layer, an anti-reflection film, and a lens. As the anti-reflection film, for example, a film produced from the composition disclosed in WO2019/017280A can be used. As the lens, for example, the structure disclosed in WO2018/092600A can be used.

The photodetector element according to the embodiment of the present invention has excellent sensitivity to light having a wavelength in the infrared region. As a result, the image sensor according to the embodiment of the present invention can be preferably used as an infrared image sensor. In addition, the image sensor according to the embodiment of the present invention can be preferably used as a sensor that senses light having a wavelength of 900 to 2,000 nm and can be more preferably used as a sensor that senses light having a wavelength of 900 to 1,600 nm.

EXAMPLES

Hereinafter, the present invention will be described more specifically with reference to Examples. Materials, amounts used, proportions, treatment details, treatment procedures, and the like shown in the following examples can be appropriately changed without departing from the gist of the present invention. Accordingly, a scope of the present invention is not limited to the following specific examples.

<Preparation of Dispersion Liquid of PbS Quantum Dots>
(Dispersion Liquid 1 of PbS Quantum Dots)

6.74 mL of oleic acid, 6.3 mmol of lead oxide, and 30 mL of octadecene were weighed and taken in a flask and heated at 120° C. under vacuum for 100 minutes to obtain a precursor solution. Then, the temperature of the solution was adjusted to 100° C., the inside of the system subsequently was made into a nitrogen flow state, and subsequently, 2.5 mmol of hexamethyldisilathiane was injected together with 5 mL of octadecene. After holding for 1 minute after the injection, the flask was naturally cooled, and at the stage where the temperature reached 30° C., 40 mL of toluene was added thereto, and a solution was recovered. An excess amount of ethanol was added to the solution, centrifugation was carried out at 10,000 rpm for 10 minutes, and the precipitate was dispersed in octane, to obtain a dispersion liquid 1 (concentration: 40 mg/mL) of PbS quantum dots, in which oleic acid was coordinated as a ligand on the surface of the PbS quantum dot. The band gap of the PbS quantum dot in the obtained dispersion liquid 1 of PbS quantum dot was estimated from light absorption measurement in the visible to infrared region by using an ultraviolet-visible-near infrared spectrophotometer (V-670, manufactured by JASCO Corporation), and it was approximately 1.35 eV.
(Dispersion Liquid 2 of PbS Quantum Dots)

A dispersion liquid 2 (concentration: 40 mg/mL) of PbS quantum dots, in which oleic acid was coordinated as a ligand on the surface of the PbS quantum dots, was obtained by the same method as in the dispersion liquid 1, except that the ratio between lead oxide and oleic acid, the synthesis temperature, and the adding amount of hexamethyldisilathiane were changed. The band gap of the PbS quantum dot in the obtained dispersion liquid 2 of PbS quantum dot was estimated from light absorption measurement in the visible to infrared region by using an ultraviolet-visible-near infrared spectrophotometer (V-670, manufactured by JASCO Corporation), and it was approximately 1.55 eV.
(Dispersion Liquid 3 of PbS Quantum Dots)

A dispersion liquid 3 (concentration: 40 mg/mL) of PbS quantum dots, in which oleic acid was coordinated as a ligand on the surface of the PbS quantum dots, was obtained by the same method as in the dispersion liquid 1, except that the ratio between lead oxide and oleic acid, the synthesis temperature, and the adding amount of hexamethyldisilathiane were changed. The band gap of the PbS quantum dot in the obtained dispersion liquid 3 of PbS quantum dot was estimated from light absorption measurement in the visible to infrared region by using an ultraviolet-visible-near infrared spectrophotometer (V-670, manufactured by JASCO Corporation), and it was approximately 1.61 eV.

(Production of Photodetector Element)

Example 1

A titanium oxide film of 50 nm was formed by sputtering on a quartz glass substrate attached with an indium-tin oxide film. Next, the above dispersion liquid 1 of PbS quantum dots was added dropwise onto the titanium oxide film formed on the substrate, and spin coating was carried out at 2,500 rpm to form a PbS quantum dot aggregate film (a step PC1). Next, as the ligand solution, a methanol solution of 25 mmol/L of zinc iodide and a methanol solution of 0.01% by volume of 3-mercaptopropionic acid were added dropwise onto the PbS quantum dot aggregate film, subsequently allowed to stand for 1 minute, and spin drying was carried out at 2,500 rpm for 20 seconds. Next, acetonitrile was added dropwise onto the PbS quantum dot aggregate film, and spin drying was carried out at 2,500 rpm for 20 seconds to carry out the ligand exchange of the ligand coordinated to the PbS quantum dot from oleic acid to 3-mercaptopropionic acid and zinc iodide (a step PC2). The operation of the step PC1 and the step PC2 as one cycle was repeated for 10 cycles, and a photoelectric conversion layer, which was the PbS quantum dot aggregate film in which the ligand had been subjected to ligand exchange from oleic acid to 3-mercaptopropionic acid and zinc iodide, was formed to a thickness of 200 nm.

Next, the above-described dispersion liquid 3 of PbS quantum dots was added dropwise onto this photoelectric conversion layer, and spin coating was carried out at 2,500 rpm to form a PbS quantum dot aggregate film (a step HT1).

Next, as the ligand solution, a methanol solution of 0.01% by volume of ethanedithiol was added dropwise, subsequently allowed to stand for 1 minute, and spin drying was carried out at 2,500 rpm. Next, acetonitrile was added dropwise onto the PbS quantum dot aggregate film, and spin drying was carried out at 2,500 rpm for 20 seconds to carry out the ligand exchange of the ligand coordinated to the PbS quantum dot from oleic acid to ethanedithiol (a step HT2). The operation of the step HT1 and step HT2 as one cycle was repeated for two cycles, and a hole transport layer, which was the PbS quantum dot aggregate film in which the ligand had been subjected to ligand exchange from oleic acid to ethanedithiol, was formed to a thickness of 40 nm.

Next, gold was formed on the hole transport layer to a thickness of 100 nm by vapor deposition to obtain a photodiode-type photodetector element.

Comparative Example 1

A photodiode-type photodetector element was obtained by the same method as in Example 1, except that in the step HT1, the dispersion liquid 1 of PbS quantum dots was used instead of the dispersion liquid 3 of PbS quantum dots.

<Evaluation of External Quantum Efficiency and Dark Current>

External quantum efficiency (EQE) and dark current were measured for each of the manufactured photodetector elements by using a semiconductor parameter analyzer (C4156, manufactured by Agilent Technologies, Inc.).

First, the current-voltage characteristics (I-V characteristics) were measured while sweeping the voltage from 0 V to −5 V in a state of not carrying out irradiation with light, and the current value at −2 V was evaluated as the dark current.

Subsequently, the I-V characteristics were measured while sweeping the voltage from 0 V to −5 V in a state of carrying out irradiation with monochrome light of 940 nm. The external quantum efficiency (EQE) was calculated from the photocurrent value in a case where −2 V was applied.

It is noted that the smaller the value, the better the dark current.

TABLE 1

| | Photoelectric conversion layer | | | Hole transport layer | | | External | |
|---|---|---|---|---|---|---|---|---|
| | Kind of dispersion liquid of PbS quantum dots | Band gap [eV] | Ligand | Kind of dispersion liquid of PbS quantum dots | Band gap [eV] | Ligand | Dark current [A/cm$^2$] | quantum efficiency [%] |
| Example 1 | Dispersion liquid 1 of PbS quantum dots | 1.35 | 3-mercaptopropionic acid Zinc iodide | Dispersion liquid 3 of PbS quantum dots | 1.61 | Ethanedithiol | $8.5 \times 10^{-8}$ | 51 |
| Comparative Example 1 | Dispersion liquid 1 of PbS quantum dots | 1.35 | 3-mercaptopropionic acid Zinc iodide | Dispersion liquid 1 of PbS quantum dots | 1.35 | Ethanedithiol | $1.3 \times 10^{-6}$ | 51 |

As shown in the above table, the photodetector element of the example had a low dark current as compared with Comparative Example 1.

Example 2

A photodiode-type photodetector element was obtained by the same method as in Example 1, except that in the step HT1, the dispersion liquid 2 of PbS quantum dots was used instead of the dispersion liquid 3 of PbS quantum dots.

Example 3

A photodiode-type photodetector element was obtained in the same method as in Example 1, except that in the step PC2, a methanol solution of 25 mmol/L of tetrabutylammonium iodide was used as the ligand solution.

Example 4

A photodiode-type photodetector element was obtained in the same method as in Example 1, except that in the step HT2, a methanol solution of 0.01% by volume of thioglycolic acid was used as the ligand solution.

Example 5

A photodiode-type photodetector element was obtained in the same method as in Example 1, except that in the step HT2, a methanol solution of 25 mmol/L of lead chloride and a methanol solution of 0.01% by volume of ethanedithiol was used as the ligand solution.

The dark currents of the photodetector elements of Examples 2 to 5 were measured by the above method. The evaluation results are shown in the table below.

TABLE 2

| | Photoelectric conversion layer | | | Hole transport layer | | | Dark current [A/cm$^2$] |
|---|---|---|---|---|---|---|---|
| | Kind of dispersion liquid of PbS quantum dots | Band gap [eV] | Ligand | Kind of dispersion liquid of PbS quantum dots | Band gap [eV] | Ligand | |
| Example 2 | Dispersion liquid 1 of PbS quantum dots | 1.35 | 3-mercaptopropionic acid Zinc iodide | Dispersion liquid 2 of PbS quantum dots | 1.55 | Ethanedithiol | $1.3 \times 10^{-7}$ |
| Example 3 | Dispersion liquid 1 of PbS quantum dots | 1.35 | Tetrabutylammonium iodide | Dispersion liquid 3 of PbS quantum dots | 1.61 | Ethanedithiol | $5.5 \times 10^{-8}$ |
| Example 4 | Dispersion liquid 1 of PbS quantum dots | 1.35 | 3-mercaptopropionic acid Zinc iodide | Dispersion liquid 3 of PbS quantum dots | 1.61 | Thioglycolic acid | $9.0 \times 10^{-8}$ |
| Example 5 | Dispersion liquid 1 of PbS quantum dots | 1.35 | Thioglycolic acid Zinc iodide | Dispersion liquid 3 of PbS quantum dots | 1.61 | Ethanedithiol Zinc chloride | $3.7 \times 10^{-8}$ |

In the photodetector elements of Examples 2 to 5 as well, the dark current was low as compared with that of Comparative Example 1. In addition, the photodetector elements of Examples 2 to 5 had the same external quantum efficiency as the photodetector element of Example 1.

In a case where an image sensor is produced by a known method by using the photodetector element obtained in Example described and incorporating it into a solid-state imaging element together with an optical filter produced according to the methods disclosed in WO2016/186050A and WO2016/190162A, it is possible to obtain an image sensor having good visible and infrared imaging performance.

In each embodiment, the same effect can be obtained even in a case where the semiconductor quantum dots of the photoelectric conversion layer and the hole transport layer are changed to PbSe quantum dots.

EXPLANATION OF REFERENCES 1, 2: photodetector element
11: upper electrode
12: lower electrode
13: photoelectric conversion layer
14: hole transport layer

What is claimed is:

1. A photodetector element comprising:
a photoelectric conversion layer containing an aggregate of semiconductor quantum dots QD1 that contain a metal atom and containing a ligand L1 that is coordinated to the semiconductor quantum dot QD1; and
a hole transport layer containing an aggregate of semiconductor quantum dots QD2 that contains a metal atom and containing a ligand L2 that is coordinated to the semiconductor quantum dot QD2, the hole transport layer being arranged on the photoelectric conversion layer,
wherein a band gap Eg2 of the semiconductor quantum dot QD2 is larger than a band gap Eg1 of the semiconductor quantum dot QD1,
a difference between the band gap Eg2 of the semiconductor quantum dot QD2 and the band gap Eg1 of the semiconductor quantum dot QD1 is between 0.10 eV and 1.0 eV, and
the band gap Eg1 of the semiconductor quantum dot QD1 is between 0.5 eV and 2.0 eV.

2. The photodetector element according to claim 1, wherein the semiconductor quantum dot QD1 and the semiconductor quantum dot QD2 each contain a Pb atom.

3. The photodetector element according to claim 1, wherein the semiconductor quantum dot QD1 and the semiconductor quantum dot QD2 each contain the same kind of semiconductor quantum dot.

4. The photodetector element according to claim 1, wherein the semiconductor quantum dot QD1 and the semiconductor quantum dot QD2 each contain PbS.

5. The photodetector element according to claim 1, wherein the ligand L1 and the ligand L2 contain at least one selected from a ligand containing a halogen atom or a polydentate ligand containing two or more coordination moieties.

6. The photodetector element according to claim 5, wherein the ligand containing a halogen atom is an inorganic halide.

7. The photodetector element according to claim 6, wherein the inorganic halide contains a Zn atom.

8. The photodetector element according to claim 1, wherein the ligand L1 contains thioglycolic acid.

9. The photodetector element according to claim 1, wherein the ligand L2 contains a compound having a thiol group.

10. The photodetector element according to claim 1, wherein the photodetector element is a photodiode-type photodetector element.

11. An image sensor comprising the photodetector element according to claim 1.

12. The image sensor according to claim 11, wherein the image sensor is an infrared image sensor.

* * * * *